United States Patent [19]

Hara

[11] Patent Number: 4,774,711
[45] Date of Patent: Sep. 27, 1988

[54] SEMICONDUCTOR LASER APPARATUS

[75] Inventor: Toshitami Hara, Tokyo, Japan

[73] Assignee: Canon Kabushiki Kaisha, Tokyo, Japan

[21] Appl. No.: 120,745

[22] Filed: Nov. 13, 1987

Related U.S. Application Data

[63] Continuation of Ser. No. 810,576, Dec. 19, 1985, abandoned.

[30] Foreign Application Priority Data

Dec. 26, 1984 [JP] Japan .................. 59-273291

[51] Int. Cl.⁴ .................................. H01S 3/19
[52] U.S. Cl. .................................. 372/50; 357/19
[58] Field of Search ...................... 372/50; 357/19

[56] References Cited

FOREIGN PATENT DOCUMENTS 0057790 5/1977 Japan .................. 372/50

Primary Examiner—William L. Sikes
Assistant Examiner—Georgia Y. Epps
Attorney, Agent, or Firm—Fitzpatrick, Cella, Harper & Scinto

[57] ABSTRACT

A semiconductor laser apparatus comprising a plurality of laser elements comprising an array, a plurality of photodetector elements respectively corresponding to the plurality of laser elements, and a light shield member. Each laser element is adapted to generate a laser beam in two directions. Each photodetector element is adapted to receive a laser beam from a laser element. The light shield member prevents the light generated by each of the plurality of laser elements from entering photodetectors other than those to which they correspond.

7 Claims, 4 Drawing Sheets

SEMICONDUCTOR LASER APPARATUS

This application is a continuation of application Ser. No. 810,576 filed Dec. 19, 1985, now abandoned.

BACKGROUND OF THE INVENTION

1. Field of the Invention

The present invention relates to a semiconductor laser apparatus, more particularly to a semiconductor laser apparatus of an array structure in which two or more semiconductor laser elements are integrally formed on a same substrate hereinafter called a laser array.

2. Description of the Prior Art

Conventional laser arrays have an arrangement as shown in FIG. 1.

FIG. 1 shows a structure involving an array of photodetector elements 93, wherein a laser array 92 and a photodetector array 93 are arranged in mutually opposed positions on a silicon substrate 91. The laser array 92 is bonded to the silicon substrate 91, and the outputs of the lasers 92a–92e are respectively supplied to the photodetectors 93a–93e of the photodetector array 93. The laser array and photodetector array are respectively bonded on the substrate.

The conventional semiconductor laser array discussed above has been associated with the following drawbacks:

(1) Considerable noise is inevitable since each photodetector element not only receives the light from a corresponding laser element but also the light from neighboring laser elements. For example, in FIG. 1, the photodetector element 93b naturally receives its largest input of light from the laser element 92b, but it also receives considerable light from the laser elements 92a, 92c etc. For this reason it is difficult to simultaneously detect the inputs from the laser elements 92a–92e without mutual interference.

(2) It has been difficult to position the different elements of the laser array in a position exactly corresponding to the elements of the photodetector array, on the substrate.

SUMMARY OF THE INVENTION

The object of the present invention is to provide a semiconductor laser device not associated with the foregoing drawbacks.

The above-mentioned objective can be achieved according to the present invention by a semiconductor laser apparatus in which a light shield member is formed, between each laser element and each photodetector element, from the vicinity of a light-emitting face of laser element to the vicinity of a light-receiving face of photodetector element to overcome the above-mentioned drawback (1). In addition each laser element and photodetector element are integrally formed to overcome the above-mentioned drawback (2).

More specifically, the present invention provides a semiconductor laser apparatus having plural laser elements arranged in an array, and plural photodetector elements integrally formed with said laser elements to correspond respectively thereto. Also provided are light shield members each of which is positioned in each area between neighboring laser elements and between neighboring photodetector elements and each of which extend from the vicinity of the lightemitting face of each laser element to the vicinity of the light-receiving face of each photodetector element. BRIEF DESCRIPTION OF THE DRAWINGS FIG. 1 is a plan view showing the arrangement of a conventional semiconductor laser device;

FIGS. 2 to 4 show a semiconductor laser device embodying the present invention, wherein FIG. 2 is a plan view thereof, FIG. 3 is a front cross-sectional view along a line A—A' in FIG. 2, and FIG. 4 is a lateral cross-sectional view along a line B—B' in FIG. 2; and FIGS. 5 to 8 illustrate variations of the present invention.

DETAILED DESCRIPTION OF THE PREFERRED EMBODIMENTS

Now the present invention will be discussed in detail with reference to the and embodiments thereof shown in the attached drawings.

Figure 1:
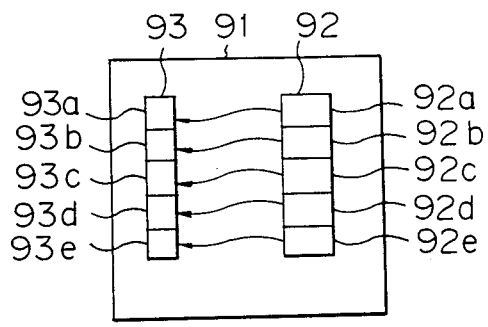
Figure 2:
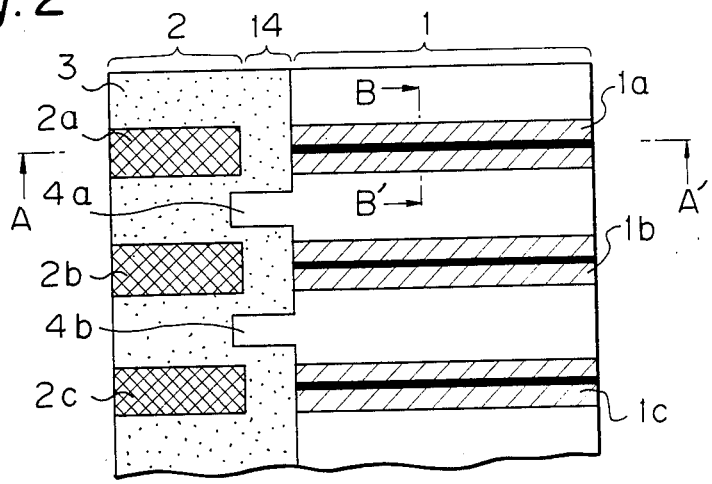
Figure 3:
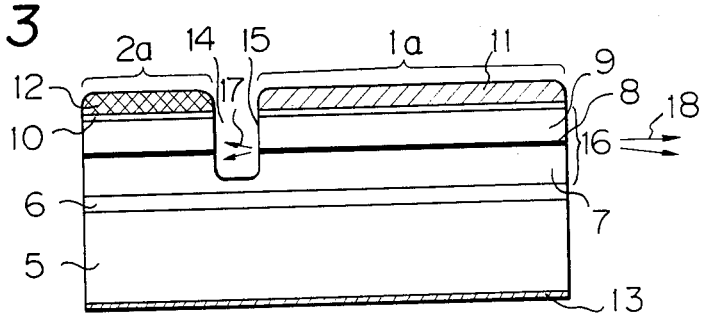
Figure 4:
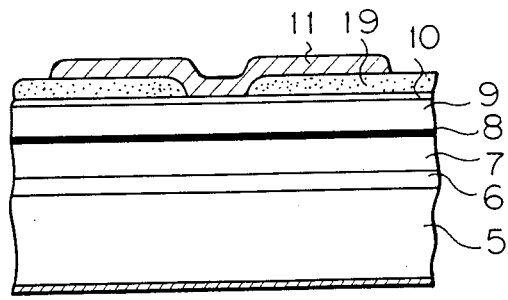

FIGS. 2 to 4 are respectively, a plan view, a front cross-sectional view and a lateral cross-sectional view of a semiconductor laser device embodying the present invention. These drawings illustrate a laser array 1, composed of laser elements 1a, 1b, 1c, . . . and a photodetector array 2 composed of photodetector elements 2a, 2b, 2c, . . . Arrays 1 and 2 are formed as a monolithic structure, for example through a photolithographic process, in such a manner that the laser elements 1a, 1b, 1c, . . . respectively correspond exactly to the photodetector elements 2a, 2b, 2c, . . . as shown in FIG. 2. Thus the photodetector elements for monitoring the output of lasers are made to correspond in a one-to-one manner to the laser elements. An active layer 8 is provided to generate light. The light generated in active layer 8 by a current flowing between electrodes 11 and 13 is taken out of layer 8 as a laser beam by resonance in layers 15 and 16. So-called clad layers 7 and 9 serve to confine the light, generated in the active layer 8, in the vicinity thereof.

Emerging beams 17, 18 emerge from each laser element. Beam 17 crosses a groove 14 to enter a corresponding photodetector element, and is converted into an output photocurrent, by means of a voltage applied across electrodes 12 and 13, which is usually of a polarity opposite to the voltage applied across the electrodes 11 and 13. An appropriate light output can be obtained by regulating the voltage across the electrodes 11 and 13, in response to the output photocurrent.

In order to prevent crosstalk between the laser elements 1a, 1b, 1c, . . . due to the reception of light by each photodetector element from uncorresponding laser elements, light shield members 4a, 4b, . . . are provided in areas positioned between the laser elements 1a, 1b, 1c, . . . and between the photodetector elements 2a, 2b, 2c, . . . these areas correspond to groove 14. Consequently, the light shield member 4a, for example, prevents the light of the laser element 1b from entering the photodetector element 2a.

Reference is now made to FIGS. 2 to 4 for explaining the method of preparing the semiconductor laser device of the present embodiment.

On a substrate 5 composed of n-type GaAs, there are developed in succession, for example by molecular epitaxy, a Si-doped n-type GaAs layer 6 of a thickness of ca. 2 μm, an n-type AlGaAs layer of 2 μm serving as the clad layer 7, a non-doped GaAs active layer 8 of 0.1 μm, a Be-doped p-type AlGaAs layer of 2 μm serving as the clad layer 9, and a p-type GaAs layer 10 of 0.2 μm.

On these developed layers grooves are then formed of a depth of 4 μm in areas 3 shown in FIG. 2, by dry etching achieved by an ion beam shower.

Finally, electrodes 11, 12, 13 are formed after the formation of current limiting areas with SiO$_2$ layers 19 for allowing current entry into the laser elements.

The crosstalk measured on the sample was as low as 5% or lower.

The dimensions of the device shown in FIG. 2 are as follows. The laser elements 1a, 1b, 1c, ... and the photodetector elements 2a, 2b, 2c, ... are arranged with a pitch of 100 μm, and the groove 14 is 10 μm (exaggerated in the illustration). Each of the light shield members 4a, 4b, ... is 30 μm wide and 15 μm long, and the end thereof is extended to a space between the neighboring photodetector elements 2a and 2b, or 2b and 2c.

In the following there are explained certain embodiments of the present invention.

Figure 5:
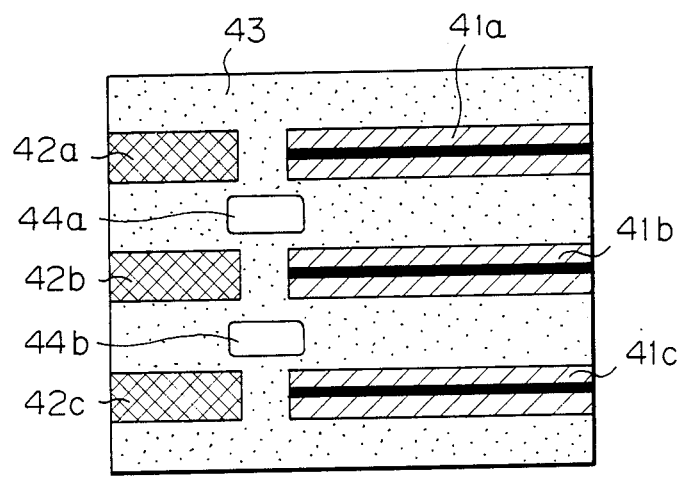
Figure 6:
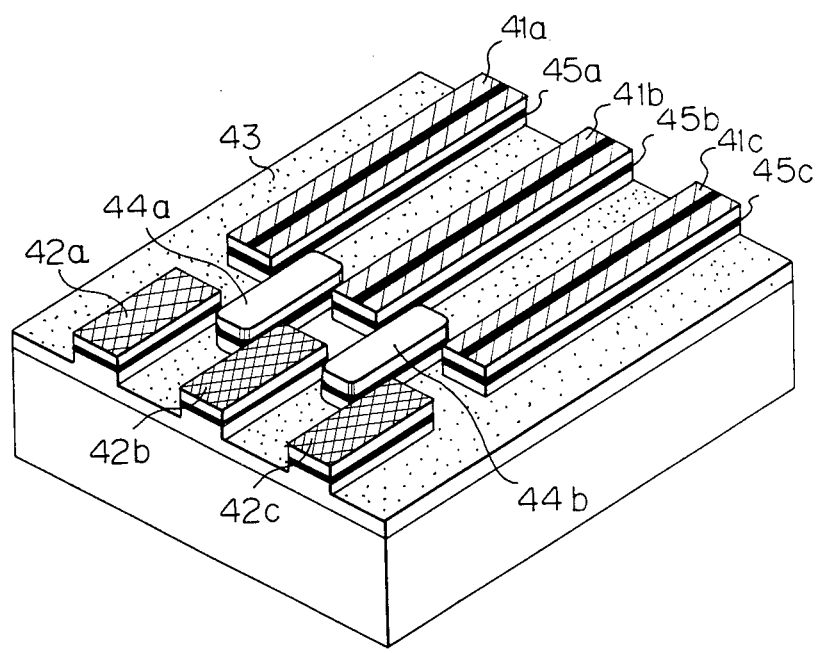

FIG. 5 shows an embodiment which is characterized, in contrast to the structure shown in FIG. 2, by the presence of etched grooves 43 in the areas between neighboring laser elements 41a-41c, and by the isolated structure of light shield members 44a, 44b as shown in perspective in FIG. 6. In FIG. 6 there are shown photodetector elements 42a-42c, and active layers 45a-45c for generating light.

Figure 7:
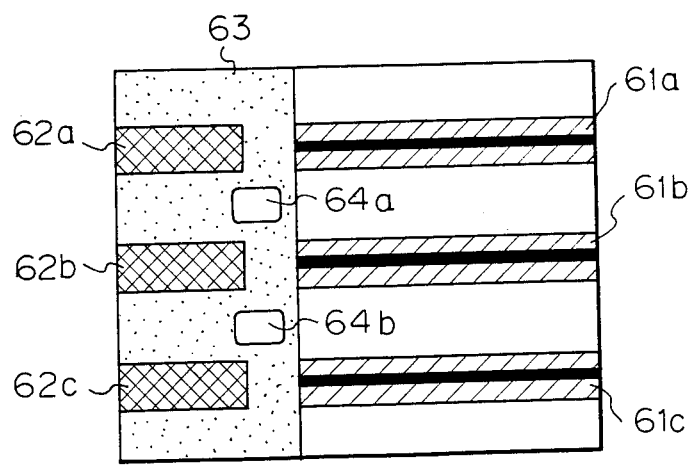

In an embodiment shown in FIG. 7, etched groove area 63 is limited to the area of photodetector elements 62a-62c in the same manner as in the structure shown in FIG. 2, while light shield members 64a, 64b are formed in an isolated manner as in the embodiment of FIG. 4. 61a-61c indicate laser elements.

Figure 8:
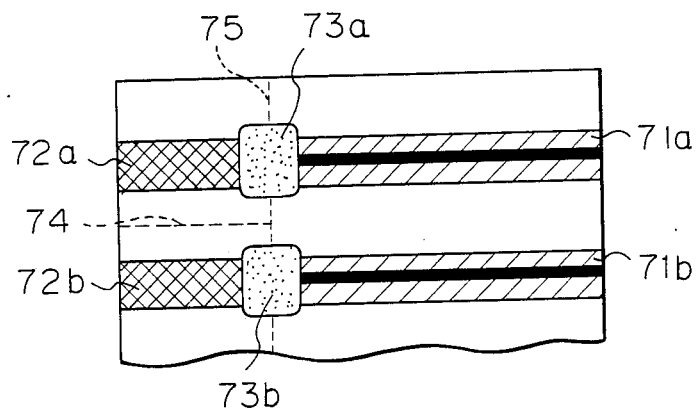

Another embodiment shown in FIG. 8 is featured by the presence of etched grooves 73a, 73b solely between the mutually facing laser elements 71a, 71b and photodetector elements 72a, 72b, and of insulating layers 74, 75 serving as the light shield members, as indicated by broken lines. Said insulating layers 74, 75 are formed by ion implantation. The light shield members are generally formed as high as the epitaxially grown layers, but they have to be approximately as high as the active layer at lowest.

In the semiconductor laser apparatus of the present invention, there is considerable freedom in the relation between the laser element and the photodetector element, but the upper electrode 12 on each photodetector element must to be cut off somewhere to the n-type clad layer 7 in order to be electrically separated from the upper electrode 11 on each laser element. Similar electric separation is also desirable among different photodetector elements, but injection electrodes alone need to be separated for the laser elements.

Though the foregoing explanation has been limited to GaAs, the present invention is naturally effectively applicable not only to other III-II compound semiconductors, such as InGaAsP, but also to any semiconductor device in which plural sets of semiconductor laser elements and photodetector elements are integrated in monolithic manner.

The pitch of the laser elements or the photodetector elements is usually selected in a range from 10 to 300 μm, but a similar effect can be expected at a smaller or larger pitch.

The light shield members are advantageously formed, for the convenience of mechanical working, of a material similar to that of the laser element or photodetector element as explained in the foregoing embodiments, but they can be in principle made by any material that is opaque to the laser light.

As explained in the foregoing, the present invention is characterized by a monolithic structure in which laser elements respectively correspond to photodetector elements and by the presence of light shield members for preventing each photodetector element from receiving the light from laser elements other than an element corresponding to said photodetector element, whereby a suitable amount of the output of said corresponding laser element can be received by the photodetector element without crosstalk. In this manner it is possible to obtain uniform outputs from the laser elements of the laser array.

What is claimed is:

1. A semiconductor laser device comprising:
   a plurality of laser elements comprising an array, wherein each of said laser elements generates a laser beam in two directions;
   a plurality of photodetector elements respectively corresponding to said plurality of laser elements for directly receiving laser beams therefrom, said photodetector elements being formed in a monolithic manner together with said laser array elements;
   wherein said device has a grooved portion for separating each of said laser element arrays from said plurality of photodetector elements; and
   a light shield member provided in said grooved portion in an area between pairs of said laser element array and said photodetector element and including a portion projecting from a bottom of said grooved portion, said light shield member preventing the light emitted from each of said laser elements from entering the photodetector elements except for the corresponding photodetector element.

2. A semiconductor laser apparatus according to claim 1, wherein said plural laser elements of the array and said photodetector elements are formed in a monolithic structure.

3. A semiconductor laser device according to claim 1 wherein said grooved portion is formed between said laser elements of said laser element array.

4. A semiconductor laser device according to claim 1 wherein said grooved portion is formed between said photodetector elements.

5. A semiconductor laser device according to claim 1, wherein said light shield member has the same height as that of said laser element from the bottom of said grooved portion.

6. A semiconductor laser device according to claim 5, wherein all of said laser elements, said photodetector elements and said light shield member are formed by a semiconductor laminated layer member made of the same material.

7. A semiconductor laser device comprising:
   a plurality of laser elements arranged in an array, wherein each of said laser elements generates a laser beam in each of two directions;
   a plurality of photodetector elements respectively corresponding to said plurality of laser elements, each for directly receiving one of the laser beams generated in the two directions by each of said laser elements; and
   light shield means provided in an area between pairs of said laser elements and said photodetector elements in a space between the adjacent laser elements and the adjacent photodetector elements, said light shield means preventing the light emitted from each of said laser elements from entering the photodetector elements except for light emitted from the corresponding photodetector element.

* * * * *

UNITED STATES PATENT AND TRADEMARK OFFICE
CERTIFICATE OF CORRECTION

PATENT NO. : 4,774,711

DATED : September 27, 1988

INVENTOR(S) : Hara

It is certified that error appears in the above-identified patent and that said Letters Patent is hereby corrected as shown below:

COLUMN 1

Line 67, "lightemitting" should read --light-emitting--.

COLUMN 2

Lines 1-2, "BRIEF DE-SCRIPTION OF THE DRAWINGS" should read --BRIEF DESCRIPTION OF THE DRAWINGS-- and be centered as a heading;

Line 5, "FIGS.2" should read --FIGS. 2--;

Line 16, "and" should be deleted;

Line 32, "An" should read --In addition, an--; and

Line 54, "these" should read --These--.

COLUMN 3

Line 7, "the sample" should read --this sample--; and

Line 67, "be in principle" should read --be, in principle--.

UNITED STATES PATENT AND TRADEMARK OFFICE
CERTIFICATE OF CORRECTION

PATENT NO. : 4,774,711

DATED : September 27, 1988

INVENTOR(S) : Hara

It is certified that error appears in the above-identified patent and that said Letters Patent is hereby corrected as shown below:

COLUMN 4

Line 33, "apparatus" should read --device--;

Line 37, "claim 1" should read --claim 1,--; and

Line 40, "claim 1" should read --claim 1,--.

Signed and Sealed this

Eighteenth Day of July, 1989

Attest:

DONALD J. QUIGG

Attesting Officer

Commissioner of Patents and Trademarks